(12) United States Patent
Boyd, Jr. et al.

(10) Patent No.: US 9,580,806 B2
(45) Date of Patent: Feb. 28, 2017

(54) METHOD OF PROCESSING A SUBSTRATE SUPPORT ASSEMBLY

(71) Applicant: Applied Materials, Inc., Santa Clara, CA (US)

(72) Inventors: Wendell Glen Boyd, Jr., Morgan Hill, CA (US); Vijay D. Parkhe, San Jose, CA (US); Sehn Thach, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 350 days.

(21) Appl. No.: 14/059,251

(22) Filed: Oct. 21, 2013

(65) Prior Publication Data

US 2015/0059974 A1 Mar. 5, 2015

Related U.S. Application Data

(60) Provisional application No. 61/871,827, filed on Aug. 29, 2013.

(51) Int. Cl.
| | |
|---|---|
| *C23C 16/06* | (2006.01) |
| *H01L 21/00* | (2006.01) |
| *C23C 16/458* | (2006.01) |
| *H01L 21/67* | (2006.01) |
| *H01L 21/683* | (2006.01) |
| *H01L 21/687* | (2006.01) |

(Continued)

(52) U.S. Cl.
CPC ........ *C23C 16/4581* (2013.01); *C23C 14/042* (2013.01); *C23C 14/221* (2013.01); *C23C 14/50* (2013.01); *C23C 16/463* (2013.01);

*C23C 16/507* (2013.01); *H01L 21/67109* (2013.01); *H01L 21/6831* (2013.01); *H01L 21/68757* (2013.01); *C23C 16/06* (2013.01)

(58) Field of Classification Search
CPC . C23C 16/4581; C23C 16/06; H01L 21/6831; H01L 21/67109; H01L 21/68757
See application file for complete search history.

(56) References Cited

U.S. PATENT DOCUMENTS 5,474,614 A * 12/1995 Robbins ................ B25B 11/002
                                                       118/728
5,880,924 A *  3/1999 Kumar ................ H01L 21/6831
                                                       279/128

(Continued)

*Primary Examiner* — Michael N Orlando
*Assistant Examiner* — Matthew Hoover
(74) *Attorney, Agent, or Firm* — Patterson + Sheridan, LLP

(57) ABSTRACT

Embodiments of the invention may generally provide a method and apparatus that is used to prepare new and used substrate support assemblies for use in typical semiconductor processing environments. Embodiments of the present invention generally relate to a method of coating a new substrate support assembly or a used substrate support assembly that is being refurbished. The deposited coating may include a surface enhancement and/or protective material that is configured to protect one or more of the components exposed to the processing environment during a semiconductor process. The substrate support assembly may be coated with a protective material and during the coating process, the substrate support assembly is maintained at a temperature that is less than or equal to 150° C. by flowing a coolant through channels formed in a base of the substrate support assembly.

13 Claims, 5 Drawing Sheets

(51) Int. Cl.
    *C23C 14/04*    (2006.01)
    *C23C 14/22*    (2006.01)
    *C23C 14/50*    (2006.01)
    *C23C 16/46*    (2006.01)
    *C23C 16/507*   (2006.01)

(56) References Cited

U.S. PATENT DOCUMENTS

2003/0161088 A1* 8/2003 Migita ............... H01L 21/6831
                                                        361/234
2008/0029032 A1* 2/2008 Sun .................... H01L 21/6833
                                                        118/728
2011/0141650 A1* 6/2011 Fujisawa ........... H01L 21/67248
                                                        361/234

* cited by examiner

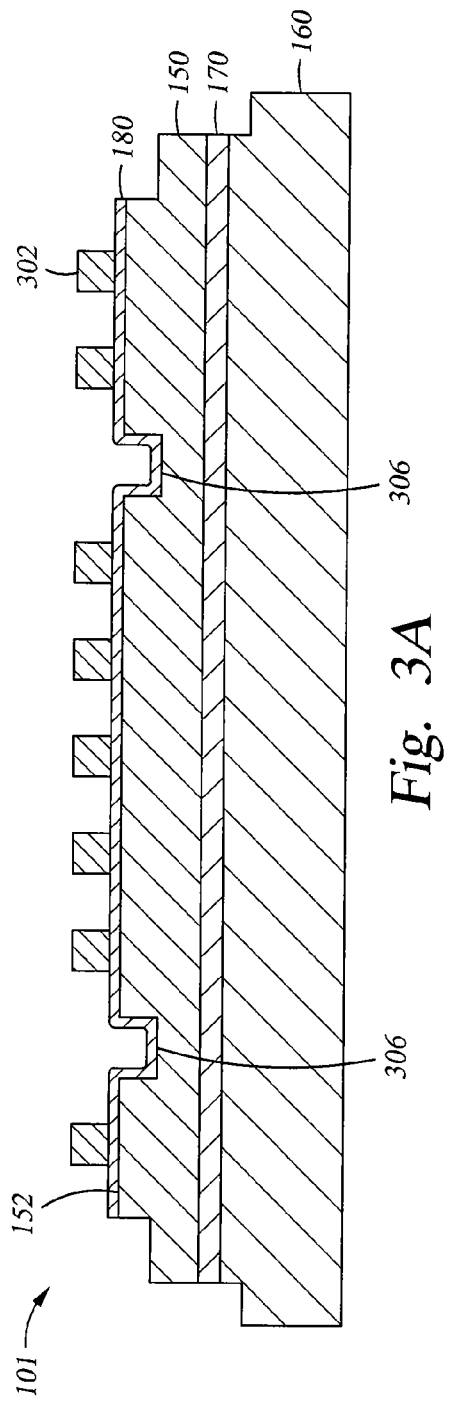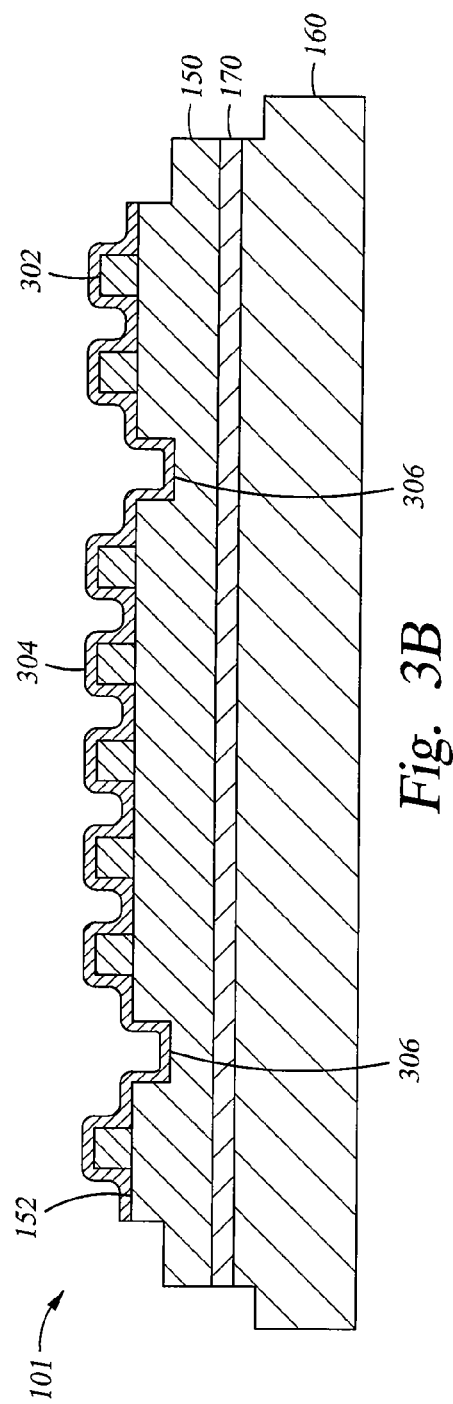
Fig. 3A
Fig. 3B

METHOD OF PROCESSING A SUBSTRATE SUPPORT ASSEMBLY

CROSS-REFERENCE TO RELATED APPLICATIONS

This application claims benefit of U.S. Provisional Patent Application Ser. No. 61/871,827, filed Aug. 29, 2013, which is herein incorporated by reference.

BACKGROUND

Field of the Invention

Embodiments of the present invention generally relate to a method of coating components of a plasma processing chamber, more specifically, to a method of coating an electro-static chuck assembly.

Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

A typical semiconductor processing chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. The substrate support assembly may include an electro-static chuck assembly that holds the substrate to the substrate support assembly during processing. During plasma processing, the energized gas is often comprised of highly corrosive species which etches and erodes exposed portions of the substrate support assembly. One example of a plasma process is an in-situ chamber cleaning process, in which the substrate support assembly is exposed to the highly corrosive species. To avoid inconsistent or undesirable process results, due to erosion induced variations in the electrical properties of the electro-static chuck, the support substrate assembly is replaced after a number of process cycles. The replacement of the substrate support assembly with a new assembly can be very costly from a material cost and machine down time perspective. Additionally, the erosion of the substrate support assembly may generate particles that can contaminate substrates being held on the substrate support assembly, thereby resulting in processing defects.

To protect the substrate support assembly from the corrosive species, a coating material may be applied to the substrate support assembly when the substrate support assembly is new and during refurbishment processes, which are performed after the substrate support assembly has been integrated into an electro-static chuck and used in a processing chamber for a period of time. Typically, the coating process is performed at an elevated temperature.

A typical substrate support assembly, such as an electro-static chuck assembly, may contain multiple components, which are bonded together by a bonding material. However, the typical bonding materials used to thermally and/or mechanically couple the various components together can degrade, outgas or change chemically or mechanically at the typical temperatures used to coat these substrate support assembly components. Therefore, the bonding materials can place limitations on the refurbishment process used to prepare a substrate support assembly for reuse, especially when the processes are performed at elevated temperatures. Therefore, there is a need for an improved method of coating substrate support components contained in an assembly, such as an electrostatic chuck assembly.

SUMMARY

Embodiments of the present invention generally relate to a method of processing a substrate support assembly, such as coating a substrate support assembly. In some configurations, the substrate support assembly may be coated with a protective material and during the coating process, the substrate support assembly is maintained at a temperature that is between 20° C. and 150° C. by flowing a coolant through channels formed in a base of the substrate support assembly.

In one embodiment, a method of forming a protective layer on a substrate support assembly is disclosed. The method includes placing the substrate support assembly in a processing chamber, wherein the substrate support assembly includes a substrate support member, a base and a connection region. The method further includes flowing a coolant through channels in the substrate support assembly, and forming the protective layer on a surface of the substrate support assembly. A temperature of the substrate support assembly is maintained at 150° C. or below.

In another embodiment, a method of forming a protective layer on a substrate support assembly is disclosed. The method includes placing the substrate support assembly in a processing chamber, flowing a coolant through channels in the substrate support assembly, and forming the protective layer on a surface of the substrate support assembly. A temperature of the substrate support assembly is maintained at 150° C. or below. The protective layer includes an alloy of group IIIB metal.

In another embodiment, a method of forming a substrate support assembly is disclosed. The method includes bonding a substrate support member to a base using a bonding material, planarizing a surface of the substrate support member, and forming a protective layer on the surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3B are enlarged cross-sectional side views of the substrate support assembly according to various embodiments of the invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention may generally provide a method and apparatus that is used to prepare new and used substrate support assemblies for use in typical semiconductor processing environments. Typical semiconductor processing environments may include an aggressive substrate processing environment that uses gases and/or vapors that attack the various components during processing. Some embodiments of the present invention generally relate to a method of coating a new substrate support assembly or a used substrate support assembly that is being refurbished. The deposited coating may include a surface enhancement and/or protective material that is configured to protect one or more of the components exposed to the processing environment during a semiconductor process.

Figure 1A:
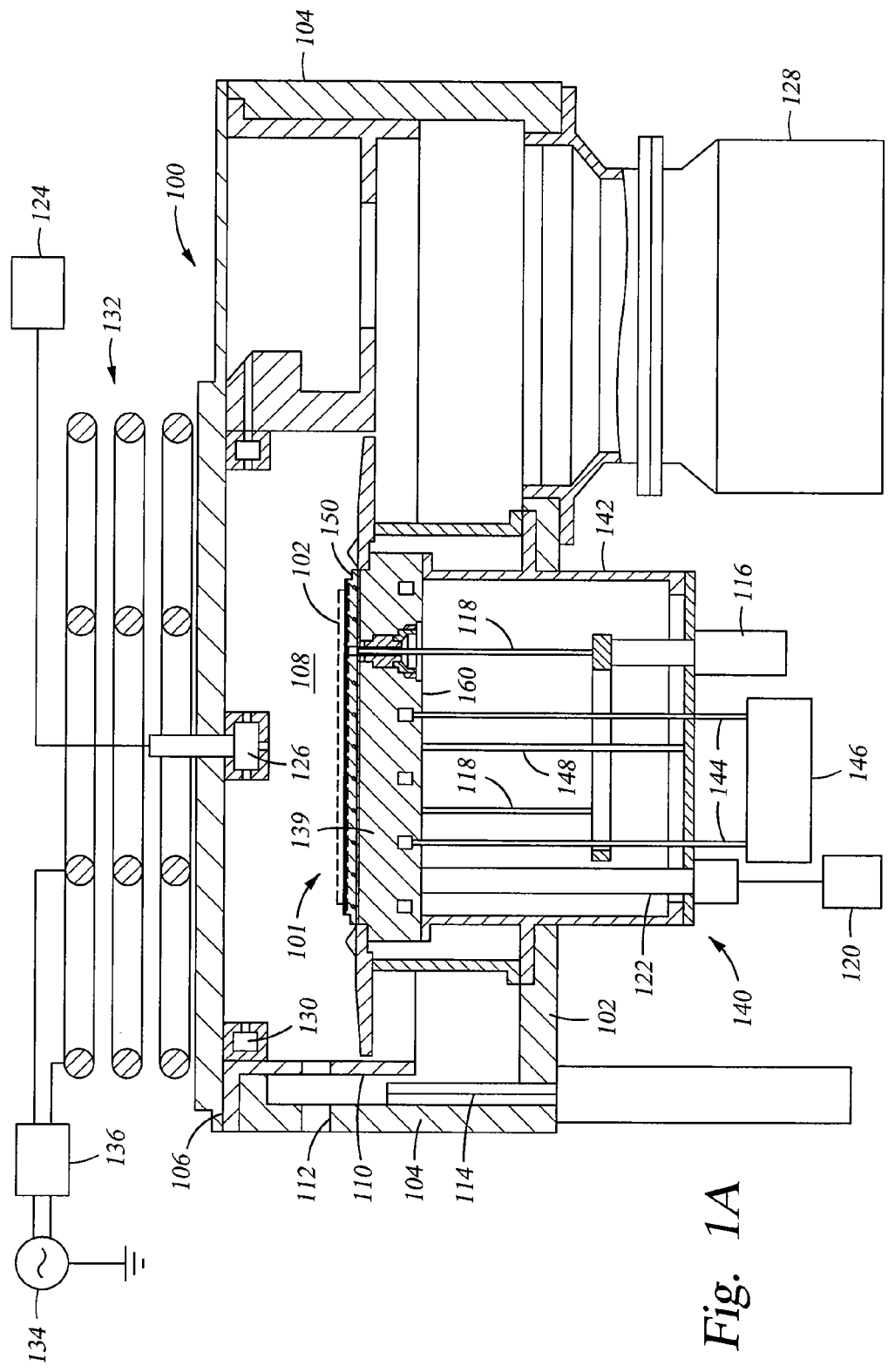
FIG. 1A is a sectional side view of a plasma processing chamber having a substrate support assembly according to embodiments of the present invention.

FIG. 1A is a sectional side view of a plasma processing chamber 100 having the substrate support assembly 101 disposed therein. The substrate support assembly 101 may be used to support a variety of substrates, such as semiconductor substrates and reticles. The substrate support assembly 101 may include an electro-static chuck assembly.

The plasma processing chamber 100 includes a bottom 102, sidewalls 104 and a chamber lid 106 disposed over the sidewalls 104 defining a processing volume 108. The plasma processing chamber 100 further includes a liner 110 disposed in the processing volume 108 to prevent the sidewalls 104 from damage and contamination from the processing chemistry and/or processing by-products. A slit valve door opening 112 is formed through the sidewall 104 and the liner 110 to allow passage of the substrates and substrate transfer mechanism disposed in a system (not shown) that is coupled to the plasma processing chamber 100. A slit valve door 114 selectively open and close the slit valve door opening 112.

The substrate support assembly 101, which includes substrate supporting elements 139 and a connection region 140, is disposed in the processing volume 108 and is supported by support(s) 142. A lift 116 is configured to raise and lower lift pins 118 relative to the substrate support assembly 101 during processing and loading/unloading the substrate 102. The connection region 140 of the substrate support assembly 101 is generally not in fluid communication with the processing volume 108. The connection region 140 includes a plurality of electrical connections (e.g., thermocouple wires, heater element wires, shielded e-chuck electrode wires, etc.) and tubes for transferring fluid through the substrate support assembly 101. In one embodiment, the connection region 140 includes the support(s) 142, cooling tubes 144 and electrical connections 122. In one configuration, the electrical connections 122 are used to couple the substrate support assembly 101 to a bias power source 120 for generating chucking force to secure the substrate 102 on the substrate support assembly 101. The connection region 140 may also include cooling tubes 144 for flowing a coolant (e.g., DI water) through the substrate support assembly 101. The cooling tubes are connected to a heat exchanger 146. A temperature measuring device 148 may be coupled to the substrate support assembly 101.

One or more processing gases may be supplied to the processing volume 108 from a gas source 124 via an inlet 126. A vacuum pump 128 is in fluid communication with the processing volume 108. The vacuum pump 128 may be used to pump the processing volume 108 and maintain a low pressure environment through a plenum 130.

The plasma processing chamber 100 includes an antenna assembly 132 disposed outside the chamber lid 106. The antenna assembly 132 may be coupled to a radio-frequency (RF) plasma power source 134 through a matching network 136. During processing, the antenna assembly 132 is energized with RF power provided by the power source 134 to ignite a plasma of processing gases within the processing volume 108 and to maintain the plasma during processing of the substrate 102.

The plasma processing chamber 100 may be used for various plasma processes. In one embodiment, the plasma processing chamber 100 may be used to perform dry etching with one or more etching agents (e.g., gases or vapors). For example, the plasma processing chamber 100 may be used for ignition of plasma from a precursor including $C_xF_y$, (where x and y can be different allowed combinations), $O_2$, $NF_3$, or combinations thereof. Embodiments of the present invention may also be used in etching chromium for photomask applications, etching a profile, such as a deep trench and through silicon vias (TSV), in a silicon substrate having oxide and metal layers disposed on the substrate. However, the plasma processing performed in the plasma processing chamber 100 may include the use of aggressive gases and/or vapors that can attack a coating 180 (see FIG. 1B) disposed on the surfaces of the substrate support assembly 101 that are exposed to the processing volume 108 during processing. After extended periods of time the coating 180 may erode due to wear and/or attack by the aggressive gases and/or vapors, and thus may need to be replaced.

Figure 1B:
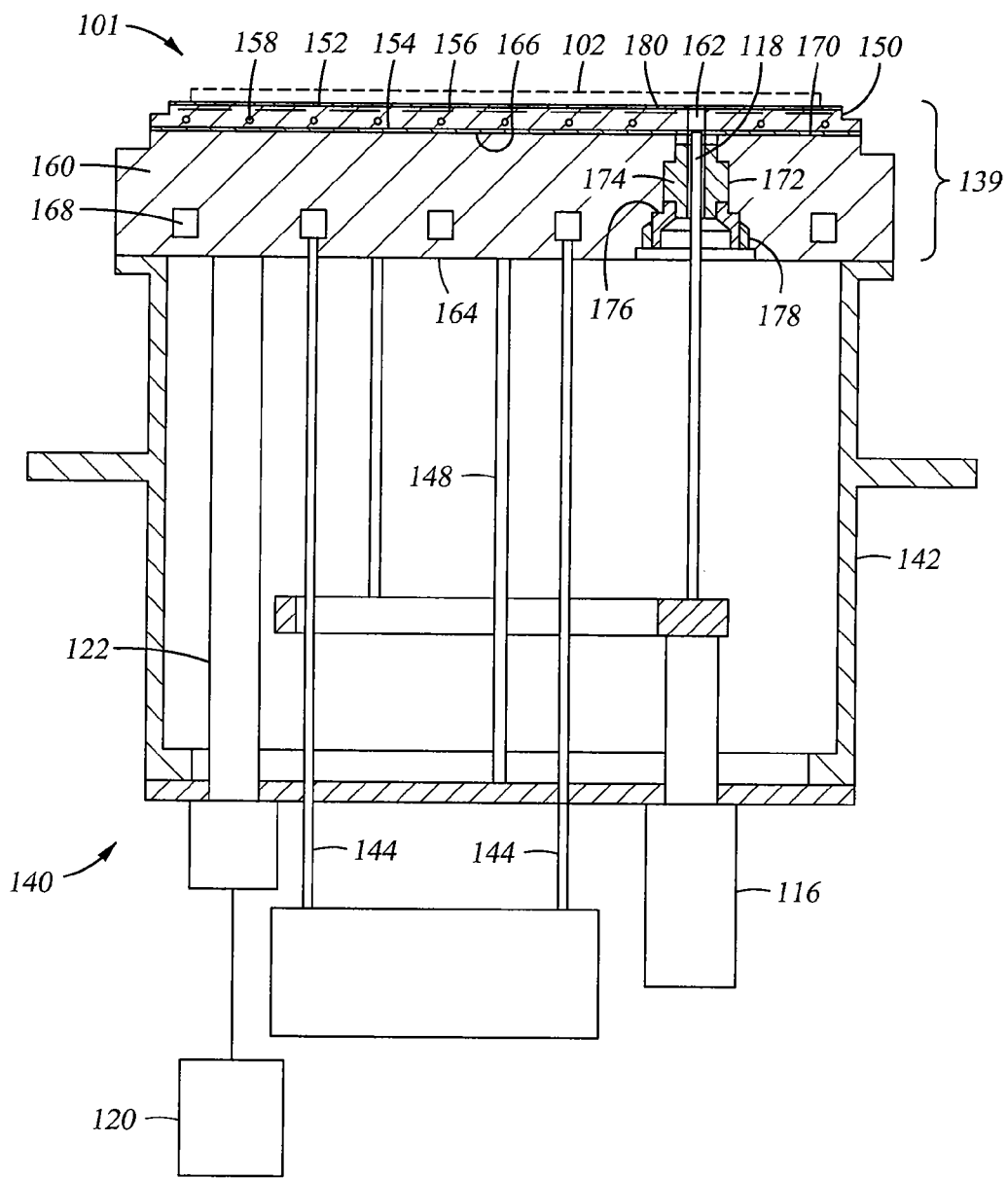
FIG. 1B is a sectional side view of the substrate support assembly according to one embodiment of the present invention.

FIG. 1B is a close-up cross-sectional side view of the substrate support assembly 101 according to one embodiment of the present invention. The substrate support assembly 101 may be movably or fixedly positioned in a substrate processing chamber (e.g., plasma processing chamber 100) for supporting a substrate during processing. The substrate support assembly 101 includes a substrate support member 150 secured to a base 160 by a bonding material 170. In some embodiments, the substrate support assembly 101 may comprise an electro-static chuck assembly.

The substrate support member 150 has a substantially planar upper surface 152 for supporting the substrate 102 thereon. A protective layer 180 is disposed on the upper surface 152 to protect the upper surface 152 from a processing environment. The substrate support member 150 also has a substantially planar lower surface 154 for receiving the bonding material 170 and coupling to the chuck base 160. The substrate support member 150 may be formed from a dielectric material. In one embodiment, the substrate support member 150 may be formed from a ceramic, such as aluminum oxide ($Al_2O_3$), aluminum nitride (AlN), titanium oxide (TiO), titanium nitride (TiN), silicon carbide (SiC) and the like. In one embodiment, the substrate support member 150 may be formed another type of material, such as a metal that is coated with a dielectric material (e.g., ceramic, polymer, etc.) or other similar configuration. In one embodiment, the substrate support member 150 may include an electrode 156 that is embedded therein. The electrode 156 may be a thin metal plate or a metal mesh that may be large enough to encompass substantially the entire area of the substrate 102. The electrode 156 may be about 200-250 micrometers from the upper surface 152. The electrode 156 may be coupled to a power source, such as a DC voltage source, via one of the electrical connections 122, to produce electrostatic chucking force to attract and secure the substrate 102 on the upper surface 152. Optionally, the electrode 156 may also be coupled to a RF power source for generating a capacitively coupled plasma in a processing chamber in which the substrate support member 150 is disposed during processing. The substrate support member 150 may also have one or more heating elements 158 formed therein for providing heating to the substrate support member 150. The one or more heating elements 158 may form multiple heating zones to obtain desired heating effect.

The substrate support member 150 may have three or more through holes 162 to allow lift pins 118 to pass therethrough. The substrate support member 150 may be shaped according to the shape of the substrate 102 being processed. For example, the substrate support member 150 may be a circular disk for supporting a circular substrate, such as a 300 mm or 450 mm semiconductor substrate. The substrate support member 150 may also be a rectangular plate for supporting rectangular substrates, such as glass substrates for forming liquid crystalline display devices.

The base 160 may include a body 164 and the connection region 140 that is bonded or coupled to the body 164. The connection region 140 may include a plurality of electrical connections 122, cooling tubes 144 and temperature measurement device(s) 148 that are used during normal substrate processing to control the process results achieved on a substrate disposed on the upper surface 152 of the substrate support member 150.

The base 160 has an upper surface 166 for receiving the bonding material 170 and the substrate support member 150. The upper surface 166 may be substantially planar. The base 160 may be formed from a thermal conductive material, such as a metal, to provide temperature control to the substrate support member 150. In one embodiment, the base 160 is formed from aluminum. The base 160 may have cooling channels 168 formed therein. The cooling channels 168 may be connected to a cooling fluid source (not shown) through the cooling tubes 144 and have cooling fluid circulated therein. The base 160 may have lift pin openings 172 formed therethrough and aligned with the through holes 162 in the substrate support member 150 for receiving lift pins 118. In one embodiment, casing elements 174, 176, 178 may be disposed in the lift pin openings 172 for guiding the lift pins 118. The casing elements 174, 176, 178 may be formed from a dielectric material, such as VESPEL® polymer or polyether ether ketone (PEEK), to provide electrical isolation between the lift pins 118 and the base 160.

The bonding material 170 is disposed between the lower surface 154 of the substrate support member 150 and the upper surface 166 of the base 160 is used to join the substrate support member 150 and the base 160 together. The bonding material 170 may be in the form of a sheet shaped similar to the substrate support member 150 and the base 160. In one embodiment, the sheet of bonding material 170 may include three or more lift pin holes corresponding to the through holes 162 for the lift pins 118.

The bonding material 170 is configured to provide secure joint between dissimilar materials, such as the ceramic substrate support member 150 and the metallic chuck base 160. The bonding material 170 also provides thermal conduction between the joined components. In one embodiment, the bonding material 170 may be a polymer based bonding adhesive with filler materials to provide thermal conductivity. The bonding material 170 may be a polymer based bonding adhesive with chemical erosion resistive fillers. In one embodiment, the filler material includes silicon and the polymer base material includes silicone. The concentration of filler material in silicone base is controlled to achieve a thermal conductivity of 1 W/mK.

Fillers in conventional bonding material may be eroded in an etching chemistry, such as a processing environment including $NF_3$ or $NF_3$ and $O_2$, generating white particles and causing contamination. Compared to bonding materials with traditional fillers, the bonding material 170 with silicone base and silicon filler does not causing particle contamination in a processing chemistry including $NF_3$ or $NF_3$ and $O_2$, thus greatly reducing particle contamination. The bonding material 170 may be protected from the etchants by any suitable design. In one embodiment, an o-ring is used to circumscribe the bonding material 170. Other designs such as forming a step in the base 160 to cover the bonding material 170 may be utilized.

The protective layer 180 is placed, coated and/or deposited at least on the upper surface 152 to provide a corrosion resistant coating that may be utilized to protect the exposed surfaces of the substrate support member 150 from the plasma and/or process gases. The protective layer 180 may have a thickness ranging from 0.5 microns to 100 microns, such as from 1 micron to 40 microns. The protective layer 180 may be coated by physical vapor deposition (PVD), chemical vapor deposition (CVD), plasma enhanced CVD (PECVD), ion assisted deposition (IAD), evaporation or molecular beam epitaxy (MBE). In one embodiment, the protective layer 180 is a rare earth ceramic layer that includes a Group IIIB metal. The Group IIIB metal may be at least one of scandium (Sc), yttrium (Y), cerium (Ce), or the like. In another embodiment, the protective layer 180 may include an oxide of Group IIIB metal, such as $Y_2O_3$, or an alloy of Group IIIB metal, such as yttrium-aluminum-garnet (YAG). In yet another embodiment, the protective layer 180 may be a bulk yttrium layer. In other embodiments, the protective layer 180 may include $Y_2O_3$ mixed in a metal. Some metals include aluminum (Al), magnesium (Mg), titanium (Ti), tantalum (Ta), and the like. In further embodiments, the protective layer 180 may include diamond like carbon (DLC). In some configurations, the protective layer 180 may include an oxide or a mixture of oxides of Group IIIA and/or Group IIIB and/or Group IV B and/or lanthanides materials. Examples of the oxides include aluminum oxide, titanium oxide, zirconium oxide, hafnium oxide, cerium oxide, samarium oxide, erbium oxide, and ytterbium oxide.

Conventionally, methods of coating the protective layer 180 may expose the substrate support assembly 101 to an elevated temperature, such as greater than 150° C. At such elevated temperature, the bonding material 170 may be damaged. Thus, conventionally the substrate support member 150 may be coated first, and then bonded to the base 160. However, the bonding process may cause the substrate support assembly 101 to bow due to thermal induced stress created by the differing coefficients of thermal expansion of the bonded parts, which causes chamber to chamber matching issues. The bowing may be concave or convex, and may be about 50 micrometers from center to edge. To resolve the bowing issue during the substrate support assembly 101 manufacturing process, the upper surface 152 of the substrate support assembly 101 may be planarized by polishing or lapping after the bonding process. If the substrate support assembly 101 is already coated with the protective layer 180, the polishing and the lapping would remove the protective layer 180. In addition, after polishing or lapping, the distance between the electrode 156 and the upper surface 152 will be inconsistent due to the removal of the bow in the upper surface 152 of the substrate support assembly 101, causing an inconsistent chucking force to be created across the surface of the "chucked" substrate.

Another issue created by not being able to place the substrate support assembly 101 into the coating chamber for the coating of the protective layer 180 is an increase in costs of refurbishing. Due to limitations in conventional substrate support assembly formation process, in order to refurbish a used substrate support assembly, the substrate support member 150 had to be first debonded from the base 160, then coated with a protective layer 180 and then rebounded to the base 160. However, the upper surface 152 of the substrate support assemblies formed using these conventional processes often became bowed or warped due to the induced thermal stress created during the bonding or high temperature coating process. As one skilled in the art will appreciate bowing or warping of the substrate supporting surface of a substrate support assembly can have a dramatic effect on the ability of the substrate support assembly to uniformly heat and/or electro-statically chuck a substrate to the substrate supporting surface during processing.

Therefore, in some embodiments of the invention, in order to resolve the bowing issue and reduce the cost of refurbishing substrate support assembly 101, a coolant is flowing through the channels 168 to keep the substrate support assembly 101 at 150° C. or below during the forming of the protective layer 180, such as between 20° C. and 150° C.

As described above, the protective layer 180 may be formed on the upper surface 152 of the substrate support member 150 by various methods. Without control of the temperature of the substrate support assembly 101, these methods may cause the substrate support assembly 101 to exceed a temperature of 150° C. during processing. To keep the temperature of the substrate support assembly 101 below 150° C., a coolant may be flowed through the cooling tubes 144 and in the channels 168 during the forming of the protective layer 180, or the process is shut down before the support assembly 101 reaches 150° C.

However, to meet the planarity and coating uniformity requirements on the substrate supporting surface needed to process semiconductor substrates today, the substrate support assembly 101 may also need to be moved, rotated and/or oscillated (see arrows in FIG. 2A) to improve the protective layer 180 deposition process, which is challenging when being done on a complete substrate support assembly 101. The substrate support assembly 101 may be moved in linearly, as shown, for example, by the arrows in FIG. 2A. In some configurations, the substrate support assembly 101 may be moved in one or more of the 3-dimensional linear directions (X, Y and Z directions) and rotated about one or more of the 3-dimensional axes as necessary to promote deposition uniformity. In one example, the substrate surface must have a flatness of between about 5 and about 11 microns (μm) over a 300 mm or 450 mm substrate supporting surface region (e.g., upper surface 152) to assure good thermal, and in some cases electrostatic chucking force, uniformity on a processed 300 mm or 450 mm substrate.

Figure 2A:
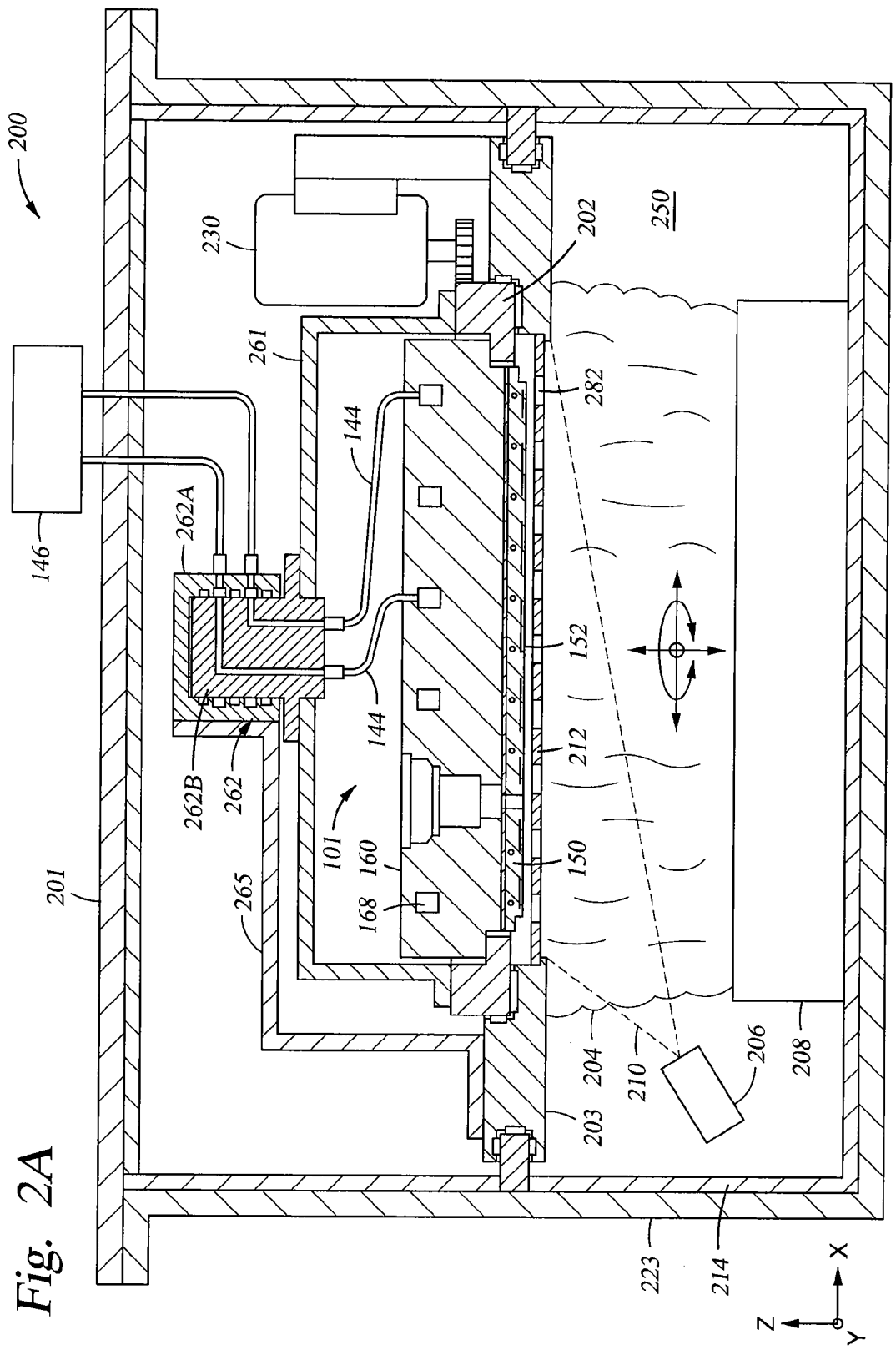
FIG. 2A is a schematic of an ion assisted deposition apparatus according to one embodiment of the invention.

FIG. 2A is a schematic of an ion assisted deposition apparatus 200 for depositing the protective layer 180 on one or more surfaces of the substrate support assembly 101. As shown, the substrate support assembly 101 is placed on the support 202 in a processing volume 250 in a way that the upper surface 152 is facing a material source 208. The support 202 may be supported by a plate 203 that is coupled to a chamber wall 223 of the deposition apparatus 200. A shield 261 is coupled to the support 202, and the shield 261 is coupled to a rotary assembly 262. The rotary assembly 262 has a stationary part 262A and a rotating part 262B. The stationary part 262A is supported by a bracket 265 and the rotating part 262B is coupled to the shield 261. During operation, the motor 230 causes the support 202 to move in directions indicated by arrows shown in FIG. 2A so the protective layer 180 may be formed uniformly on the upper surface 152. The material source 208 provides a flux of deposition materials 204, while an energetic ion source 206 provides a flux of the energetic ions 210, both of which impinge upon the upper surface 152 of the substrate support assembly 101 throughout the deposition process. The ion assisted deposition may utilize one or more plasmas or beams to provide the material and energetic ion sources. Reactive species may also be provided during deposition of the protective layer 180. In one embodiment, the energetic ions 210 include at least one of non-reactive species (e.g., argon) or reactive species (e.g., oxygen). In one embodiment, a mask 212 may be placed between the substrate support assembly 101 and the material source 208 covering portions of the upper surface 152, so the deposition materials 204 is not deposited on the covered portion of the upper surface 152. The mask 212 can be used to deposit a plurality of mesas on the upper surface 152, which is further described in conjunction with FIGS. 3A and 3B below.

The deposition materials 204 may be any of the aforementioned materials for the protective layer 180 and may be at an elevated temperature in order to be in the vapor phase. In one embodiment, the temperature of the deposition materials 204 is about 270° C. In addition, as the deposition materials 204 are deposited on the upper surface 152 as a solid layer, energy provided by the latent heat of vaporization also heats the substrate support assembly 101. In order to keep the substrate support assembly 101 at a temperature that is at 150° C. or below, a heat exchanger 146 is connected to the substrate support assembly 101 to provide a coolant flowing through the rotator assembly 262 and the cooling tubes 144. The coolant may be any cooling fluid, such as deionized water at room temperature. The room temperature deionized water can be configured to keep the various components within the substrate support assembly 101 at a temperature that is less than 150° C., such as less than 130° C. In one embodiment, the temperature of the substrate support assembly 101 is at 90° C. during the forming of the protective layer 180. After the protective layer 180 is formed on the upper surface 152, a cleaning process using ultrasonic cleaning in an aqueous solution (e.g., DI water) may be performed on the substrate support assembly 101.

In one embodiment, the substrate support assembly 101 is rotated and/or moved by the motor 230 during the process of forming of the protective layer 180 while a coolant is also flowed through the substrate support assembly 101. Thus, in some configurations of the deposition apparatus 200 the complete substrate support assembly 101 (e.g., supporting elements 139 and connection region 140) is disposed inside the processing volume 250 of the deposition apparatus 200. In one configuration, the motor 230 is coupled to the support 202, or directly to the substrate support assembly 101, to impart a linear, rotational or oscillating motion to the substrate support assembly 101. In one configuration, the elements in the connection region 140 of the substrate support assembly 101 are at least partially isolated from the process volume 250 by the metallic shield 261 that extends over the connection region 140 and is sealably coupled to a surface of the support 202.

In one embodiment, the coolant is not flowed through the substrate support assembly 101 to cool the substrate support assembly 101 during the forming of the protective layer 180. Instead, the forming process stops as the substrate support assembly 101 reaches a certain temperature, such as 120° C. The processing chamber is then cooled to an acceptable temperature, such as less than 90° C., before the process is continued. In this manner, the substrate support assembly 101 will not reach a temperature at which the bonding material 170 is damaged. To help with cooling the chamber, cooling baffles 214 may be added to the chamber 200. The chamber walls 223 may have cooling fluid flowing therethrough. Thus, opening the baffles 214 may cool the processing chamber at a faster rate.

Figure 2B:
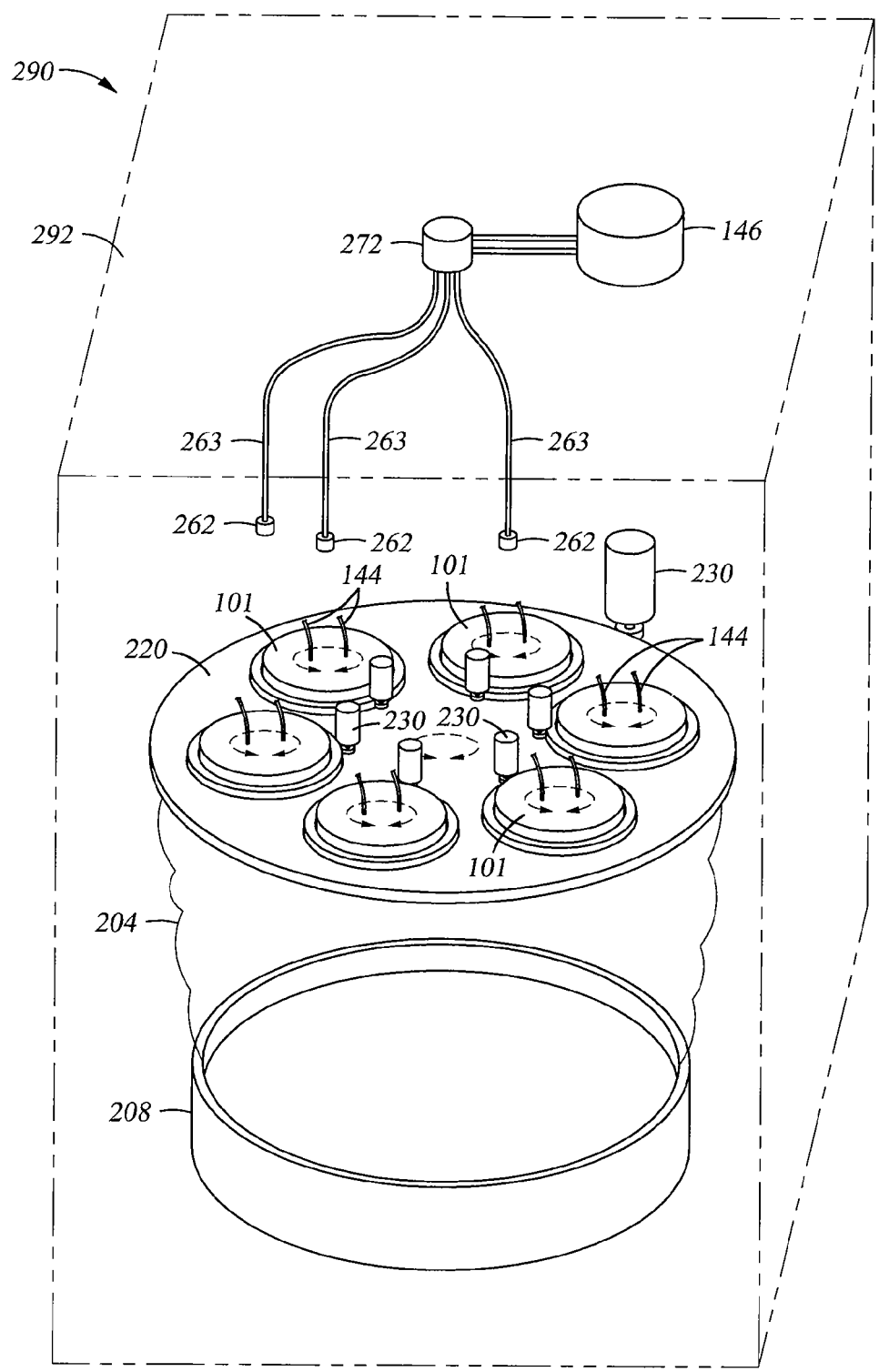
FIG. 2B is an isometric view of a support having multiple substrate support assemblies disposed therein according to one embodiment of the invention.

Multiple substrate support assemblies 101 may be coated at once and may be rotated to obtain a more uniform protective layer 180 on each of the substrate support assembly 101 during the deposition process. FIG. 2B is an isometric view of a support 220 having a plurality of substrate support assemblies 101 disposed therein. In one embodiment, as shown in FIG. 2B, six substrate support assemblies 101 are disposed on the support 220 within a processing chamber 290.

A material source 208 is disposed below the substrate support assemblies 101 and the upper surface 152 (not shown) of each substrate support assembly 101 is disposed so that it faces the material source 208. The deposition materials 204 is vaporized and deposited on the upper surface 152. The deposition may be assisted with energetic ions from an ion source, such as the ion source 206 shown in FIG. 2A. The support 220 with a plurality of substrate support assemblies 101 may be disposed in any deposition chambers for depositing the protective layer 180 on the upper surface 152 of the substrate support assembly 101.

During the deposition of the protective layer 180, each substrate support assembly 101 and the support 220 are moved by the motor 230. Again the motor 230 is coupled to the support 220, and/or directly to the substrate support assemblies 101, to impart a linear, rotational or oscillating motion to the substrate support assemblies 101. Rotating the substrate support assemblies 101 during the deposition process leads to a more uniformly deposited protective layer 180. As described above, a coolant is flowed through each substrate support assembly 101 through the cooling tubes 144 and the rotary assembly 262 to maintain the temperature below 150° C., so the bonding layer in the substrate support assembly 101 is not damaged. One will note that three of the possible six rotary assemblies 262 and the connections between the tubing 144 and rotary assemblies 262 are not shown in FIG. 2B for clarity of illustration reasons. A rotary assembly 272 may be utilized to allow the substrate support assemblies 101 and the support 220 to rotate relative to the outer chamber wall 292, while allowing the coolant to flow to the rotary assemblies 262 without causing the connecting tubing 263 to twist and bind due to the relative rotational motion of these parts. In this case, the substrate support assemblies 101 are able to rotate relative to the support 220 and the substrate support assemblies 101 and the support 220 are able to rotate relative to the outer chamber wall 292, while allowing a cooling fluid delivered from the stationary heat exchanger 146 to provide a coolant to the rotating substrate support assemblies 101.

Based on the method described above, the substrate support assembly 101 may be formed first by bonding the substrate support member 150 to the base 160 by the bonding material 170. The bowing in the substrate support assembly 101 caused by the bonding process is then resolved by polishing or lapping the upper surface 152 of the substrate support member 150. Then the substrate support assembly 101 may be placed in a processing chamber for the coating of the upper surface 152 with the protective layer 180. The substrate support assembly 101 is connected to a heat exchanger via cooling tubes and connectors so a coolant is flowed through the substrate support assembly. The substrate support assembly 101 is moved by the actuator assembly during the coating process so a more uniform protective layer is formed. Even though the coating process provides enough energy to create an elevated temperature during processing, the coolant flowing through the channels 168 helps maintain the substrate support assembly 101 at a temperature at which the bonding material 170 may not be damaged. The refurbishing process is also improved by the method described above. The used substrate support member 150 will not need to be debonded from the base 160 before recoating of the protective layer 180. The entire used substrate support assembly 101 may be placed in the deposition chamber for the deposition of the protective layer 180. Again the used substrate support assembly is connected to a heat exchanger via cooling tubes and connectors so a coolant is flowed through the used substrate support assembly. In addition, the used substrate support assembly is moved by the actuator assembly during the coating process so a more uniform protective layer is formed.

FIGS. 3A and 3B are cross-sectional side views of the substrate support assembly 101 after a coating process has been performed on the upper surface 152 using one of the deposition apparatuses described herein. FIG. 3A illustrates a plurality of mesas 302 that can be deposited on the protective layer 180 using a mask 212. Both the protective layer 180 and the plurality of mesas 302 may be formed in the ion assisted deposition apparatus 200 illustrated in FIG. 2A. The protective layer 180 may be formed without the mask 212 and the plurality of mesas 302 may be formed using the holes 282 in the mask 212 to define the dimensions of the mesas 302. Alternatively, the mesas 302 may be formed by first forming a blanket layer on the protective layer 180, placing a mask on the blanket layer and then etching away at least a portion of the exposed regions of the blanket layer. The plurality of mesas 302 helps minimize contact between the substrate 102 and the substrate support assembly 101 when a substrate is positioned on the substrate support assembly 101 during processing. The plurality of mesas 302 may or may not be the same material as the protective layer 180. In one embodiment, the plurality of mesas 302 are made of aluminum oxide while the protective layer 180 is made of yttrium oxide. During deposition, the protective layer 180 is first formed on the upper surface 152, and then the plurality of mesas 302 are formed on the protective layer 180. The upper surface 152 may have a plurality of gas passages 306 for a backside cooling gas to flow through and across the upper surface 152 of the substrate support assembly 101. The gas passages 306 are typically covered by the protective layer 180.

Alternatively, in another embodiment, the plurality of mesas 302 may be deposited first on the upper surface 152, as shown in FIG. 3B. Following the deposition of the plurality of mesas 302, a blanket deposition of a protective layer 304 is then formed over the upper surface 152 and the plurality of mesas 302.

In summary, a coolant may be flowed through channels in a substrate support assembly during the forming of a protective layer on the substrate support assembly to prevent the substrate support assembly from reaching a temperature that may damage a bonding layer in the substrate support assembly. Forming the protective layer on the substrate support assembly after the bonding of components to form the substrate support assembly resolves the bowing issue, while maintaining the planarity and coating uniformity requirements. In addition, used substrate support assemblies may not need to be debonded before a refurbishment process. Refurbishment cost and complexity is thus reduced as a result of the process described herein.

While the foregoing is directed to embodiments of the present invention, other and further embodiments of the invention may be devised without departing from the basic scope thereof, and the scope thereof is determined by the claims that follow.

The invention claimed is:

1. A method of forming a protective layer on a work piece, comprising: placing the work piece in a processing volume of a processing chamber, wherein the work piece is a substrate support assembly that includes a substrate support member, a base, cooling tubes coupled to channels formed in the substrate support assembly, and a bonding material coupling the substrate support member and the base; connecting the cooling tubes to the processing chamber; flowing a coolant through the channels in the work piece while the work piece is disposed in the processing volume; forming the protective layer on a surface of the work piece, wherein the protective layer comprises a group IIIB metal, wherein a temperature of the substrate support assembly is maintained at below 150° C., while the coolant is flowing through the channels; disconnecting the cooling tubes from the processing chamber; and removing the work piece from the processing chamber, wherein the work piece is configured to support a substrate in a separate substrate processing chamber.

2. The method of claim 1, wherein the substrate support member comprises aluminum oxide, aluminum nitride, titanium oxide, titanium nitride or silicon carbide.

3. The method of claim 2, wherein the base comprises a metal.

4. The method of claim 1, wherein the bonding material comprises a thermally conductive polymer.

5. The method of claim 1, wherein the protective layer has a thickness ranging from 0.1 microns to 100 microns.

6. The method of claim 1, wherein the temperature of the work piece is maintained at below 90° C.

7. The method of claim 1, wherein the work piece is moved by an actuator assembly while the work piece is connected to a fluid source.

8. The method of claim 1, wherein the coolant is deionized water at room temperature.

9. A method of forming a work piece, comprising: bonding a substrate support member to a base using a bonding material; planarizing a surface of the substrate support member after the substrate support member has been bonded to the base; and forming a protective layer on the planarized surface, wherein the protective layer comprises a group IIIB metal, wherein the forming the protective layer on the planarized surface comprises: placing the work piece in a processing volume of a processing chamber, wherein the work piece is a substrate support assembly that includes the substrate support member, the base, cooling tubes coupled to channels formed in the substrate support assembly, and the bonding material; connecting the cooling tubes to the processing chamber; flowing a coolant through the channels in the work piece while the work piece is disposed in the processing volume; maintaining a temperature of the work piece at below 150° C. during the forming of the protective layer, while the coolant is flowing through the channels; disconnecting the cooling tubes from the processing chamber; and removing the work piece from the processing chamber, wherein the work piece is configured to support a substrate in a separate substrate processing chamber.

10. The method of claim 9, wherein the substrate support member comprises aluminum oxide, aluminum nitride, titanium oxide, titanium nitride or silicon carbide.

11. The method of claim 10, wherein the base comprises a metal.

12. The method of claim 9, wherein the protective layer has a thickness ranging from 0.1 microns to 100 microns.

13. The method of claim 9, wherein the temperature of the work piece is maintained at below 90° C.

* * * * *